(12) United States Patent
Chae et al.

(10) Patent No.: US 7,183,579 B2
(45) Date of Patent: Feb. 27, 2007

(54) GALLIUM NITRIDE (GAN)-BASED SEMICONDUCTOR LIGHT EMITTING DIODE AND METHOD FOR MANUFACTURING THE SAME

(75) Inventors: Seung Wan Chae, Kyungki-do (KR); Suk Kil Yoon, Kyungki-do (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 0 days.

(21) Appl. No.: 10/811,808

(22) Filed: Mar. 30, 2004

(65) Prior Publication Data
US 2005/0224811 A1    Oct. 13, 2005

(30) Foreign Application Priority Data
Oct. 1, 2003    (KR) .................. 10-2003-0068166

(51) Int. Cl.
*H01L 27/15* (2006.01)
(52) U.S. Cl. .................. 257/81; 257/94; 257/99; 257/103
(58) Field of Classification Search ............... None
See application file for complete search history.

(56) References Cited

U.S. PATENT DOCUMENTS

| | | | |
|---|---|---|---|
| 5,563,422 A | | 10/1996 | Nakamura et al. |
| 6,107,648 A | * | 8/2000 | Shakuda et al. ............ 257/103 |
| 6,117,700 A | | 9/2000 | Orita et al. |
| 6,649,942 B2 | * | 11/2003 | Hata et al. .................. 257/103 |
| 2001/0002139 A1 | * | 5/2001 | Hiraoka ....................... 347/238 |

FOREIGN PATENT DOCUMENTS

| | | |
|---|---|---|
| JP | 08-032115 | 2/1996 |
| JP | 09-129919 | 5/1997 |
| JP | 09/129919 | 5/1997 |
| JP | 09-129933 | 5/1997 |
| JP | 10/173222 | 6/1998 |
| JP | 10-173222 | 6/1998 |
| JP | 10-173224 | 6/1998 |
| JP | 10/173224 | 6/1998 |
| JP | 10-341039 | 12/1998 |
| JP | 2001-035796 | 2/2001 |

OTHER PUBLICATIONS

Patent Abstracts of Japan—Publication No. 2001-035796, filed Feb. 9, 2001.

\* cited by examiner

*Primary Examiner*—Wai-Sing Louie
(74) *Attorney, Agent, or Firm*—Lowe Hauptman & Berner, LLP.

(57) ABSTRACT

Disclosed are a GaN-based semiconductor light emitting diode and a method for manufacturing the same. The GaN-based semiconductor light emitting diode includes a substrate on which a GaN-based semiconductor material is grown; a lower clad layer formed on the substrate, and made of a first conductive GaN semiconductor material; an active layer formed on a designated portion of the lower clad layer, and made of an undoped GaN semiconductor material; an upper clad layer formed on the active layer, and made of a second conductive GaN semiconductor material; an alloy layer formed on the upper clad layer, and made of an alloy selected from the group consisting of La-based alloys and Ni-based alloys; and an TCO layer formed on the alloy layer. The alloy layer has a high transmittance and forms Ohmic contact, thus reducing a contact resistance.

6 Claims, 5 Drawing Sheets

GALLIUM NITRIDE (GAN)-BASED SEMICONDUCTOR LIGHT EMITTING DIODE AND METHOD FOR MANUFACTURING THE SAME

BACKGROUND OF THE INVENTION

1. Field of the Invention

The present invention relates to a GaN-based semiconductor light emitting diode, and more particularly to a GaN-based semiconductor light emitting diode in which a contact resistance at contact areas with electrodes is reduced and optical transmittance is improved, and a method for manufacturing the GaN-based semiconductor light emitting diode, thus obtaining a high luminance property at a constant driving voltage.

2. Description of the Related Art

Recently, LED displays, serving as visual information transmission media, starting from providing alpha-numerical data have been developed to provide various moving pictures such as CF images, graphics, video images, etc. Further, the LED displays have been developed so that light emitted from the displays is changed from a solid color into colors in a limited range using red and yellowish green LEDs and then into total natural colors using the red and yellowish green LEDs and a newly proposed GaN high-brightness blue LED. However, the yellowish green LED emits a beam having a brightness lower than those of the red and blue LEDs and a wavelength of 565 nm, which is unnecessary for displaying the three primary colors of light. Accordingly, with the yellowish green LED, it is impossible to substantially display the total natural colors. Thereafter, in order to solve the above problems, there has been produced a GaN high-brightness pure green LED, which emits a beam having a wavelength of 525 nm suitable for displaying the total natural colors.

Generally, the above-described GaN-based semiconductor light emitting diode is grown on an insulating sapphire substrate. Accordingly, differing from a GaAs-based semiconductor light emitting diode, an electrode is not formed on a rear surface of the substrate and both electrodes are all formed on a front surface of the substrate on which crystals are grown. FIG. 1 illustrates a structure of the above conventional GaN-based light emitting diode.

With reference to FIG. 1, a GaN-based light emitting diode 20 comprises a sapphire substrate 11, a lower clad layer 13 made of a first conductive semiconductor material, an active layer 14, and a second clad layer 15 made of a second conductive semiconductor material. Here, the first clad layer 13, the active layer 14 and the second clad layer 15 are sequentially formed on the sapphire substrate 11.

The lower clad layer 13 includes an n-type GaN layer 13a and an n-type AlGaN layer 13b. The active layer 14 includes an undoped InGaN layer having a multi-quantum well structure. The upper clad layer 15 includes a p-type GaN layer 15a and a p-type AlGaN layer 15b. Generally, semiconductor crystalline layers, i.e., the lower clad layer 13, the active layer 14 and the upper clad layer 15, are grown on the sapphire substrate 11 using a process such as the MOCVD (Metal Organic Chemical Vapor Deposition) method. In order to improve lattice matching of the n-type GaN layer 13a with the sapphire substrate 11, an AlN/GaN buffer layer (not shown) may be formed on the sapphire substrate 11 prior to the growth of the n-type GaN layer 13a thereon.

As described above, in order to form both electrodes on an upper surface of the electrically insulating sapphire substrate 11, designated portions of the upper clad layer 15 and the active layer 14 are removed by etching, thereby selectively exposing the lower clad layer 13, more specifically, the n-type GaN layer 13a, to the outside, and allowing a first electrode 21 to be formed on the exposed portion of the n-type GaN layer 13a.

The p-type GaN layer 15a has a comparatively high resistance, and requires an additional layer for forming Ohmic contact serving as conventional electrodes. U.S. Pat. No. 5,563,422 (Applicant; Nichia Chemical Industries, Ltd., and Issue Date; Oct. 8, 1006) discloses a method for forming a transparent electrode 18 made of Ni/Au for forming Ohmic contact prior to the formation of a second electrode 22 on the p-type GaN layer 15a. The transparent electrode 18 increases a current injection area and forms Ohmic contact, thus reducing forward voltage ($V_f$).

Although the transparent electrode 18 made of Ni/Au is thermally treated, the transparent electrode 18 has a low transmittance of approximately 60% to 70%. The low transmittance of the transparent electrode 18 decreases overall light emitting efficiency of a package of the light emitting diode obtained by a wire-bonding method.

In order to solve the above low transmittance problem, there has been proposed an ITO (Indium Tin Oxide) layer having a transmittance of approximately 90% or more as a substitute for the Ni/Au layer. Since ITO has a weak adhesive force with GaN crystals and a work function of 4.7~5.2 eV while the p-type GaN has a work function of 7.5 eV, in case that the ITO layer is directly deposited on the p-type GaN layer, Ohmic contact is not formed. Accordingly, in order to form Ohmic contact by reducing a difference of the work functions between the ITO layer and the p-type GaN layer, the conventional p-type GaN layer is doped with a material having a low work function such as Zn or is high-density doped with C, thus reducing the work function and allowing ITO to be deposited thereon. However, in case that Zn or C having a high mobility is used for a long period of time, Zn or C is diffused into the p-type GaN layer, thus deteriorating reliability of the obtained light emitting diode.

Accordingly, there have been required a GaN-based semiconductor light emitting diode, which forms Ohmic contact between a p-type GaN layer and electrodes and maintains a high transmittance in order to form the electrodes, and a method for manufacturing the GaN-based semiconductor light emitting diode.

SUMMARY OF THE INVENTION

Therefore, the present invention has been made in view of the above problems, and it is an object of the present invention to provide a GaN-based semiconductor light emitting diode, which employs an ITO layer having a high transmittance and serving as a transparent electrode and solves problems caused by a contact resistance between the ITO layer and a p-type GaN layer.

It is another object of the present invention to provide a method for manufacturing the GaN-based semiconductor light emitting diode.

In accordance with one aspect of the present invention, the above and other objects can be accomplished by the provision of a GaN-based semiconductor light emitting diode comprising: a substrate on which a GaN-based semiconductor material is grown; a lower clad layer formed on the substrate, and made of a first conductive GaN semiconductor material; an active layer formed on a designated portion of the lower clad layer, and made of an undoped GaN semiconductor material; an upper clad layer formed on the active layer, and made of a second conductive GaN semiconductor material; an alloy layer formed on the upper clad layer, and made of an alloy selected from the group consisting of La-based alloys and Ni-based alloys; and a TCO (Transparent Conduct Oxide) layer formed on the alloy layer.

Preferably, the alloy layer may have a thickness of 100 Å or less. Further, preferably, the La-base alloy may be $LaNi_5$, and the Ni-based alloy may be ZnNi or MgNi.

Preferably, the TCO (Transparent Conduct Oxide) layer is made of at least one material selected from the group consisting of ITO, ZnO, Indium Oxide and MgO.

In accordance with another aspect of the present invention, there is provided a method for manufacturing a GaN-based semiconductor light emitting diode comprising the steps of: (a) preparing a substrate on which a GaN-based semiconductor material is grown; (b) forming a lower clad layer, made of a first conductive GaN semiconductor material, on the substrate; (c) forming an active layer, made of an undoped GaN semiconductor material, on the lower clad layer; (d) forming an upper clad layer, made of a second conductive GaN semiconductor material, on the active layer; (e) removing designated portions of the upper clad layer and the active layer so as to expose a portion of the lower clad layer; (f) forming an alloy layer, made of an alloy selected from the group consisting of La-based alloys and Ni-based alloys, on the upper clad layer; and (g) forming a TCO (Transparent-Conduct Oxide) layer formed on the alloy layer.

Preferably, the alloy layer may have a thickness of 100 Å or less. Further, preferably, the La-base alloy may be $LaNi_5$, and the Ni-based alloy may be ZnNi or MgNi.

Preferably, the TCO (Transparent Conduct Oxide) layer is made of at least one material selected from the group consisting of ITO, ZnO, Indium Oxide and MgO.

Preferably, the step (f) may be performed such that the alloy layer is grown on the upper clad layer by a physical vapor evaporation method, and the step (g) may be performed such that the ITO layer is grown on the alloy layer by a physical vapor evaporation method.

The method may further comprise the step of (h) thermally treating the ITO layer. Here, the ITO layer may be thermally treated at a temperature of approximately 200° C. or more for 30 seconds or more in an air atmosphere.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, preferred embodiments of the present invention will be described in detail with reference to the annexed drawings.

Figure 1:
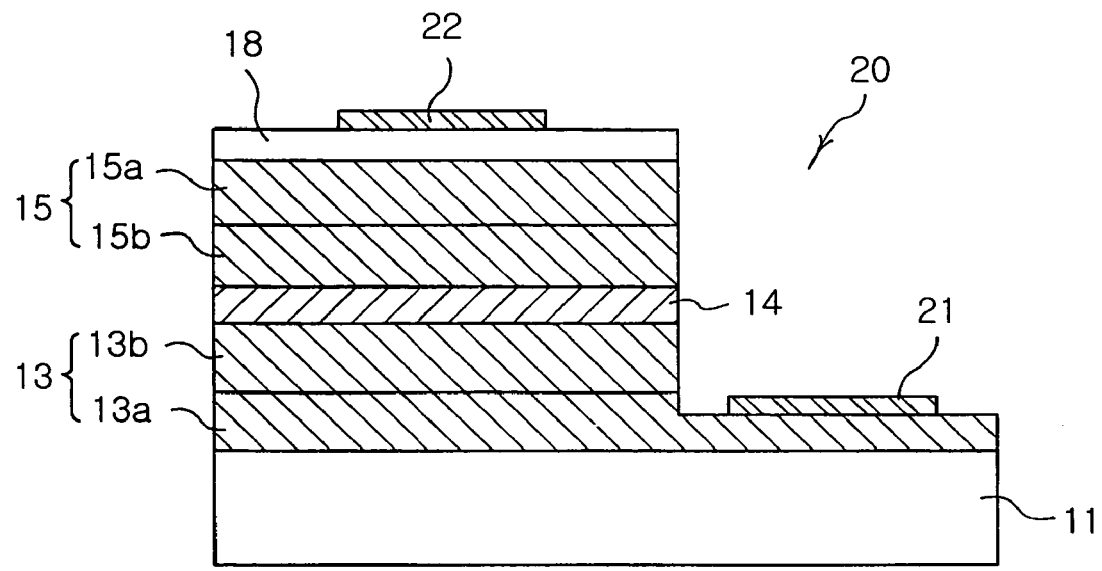
FIG. 1 is a cross-sectional view of a conventional GaN-based semiconductor light emitting diode.
Figure 2:
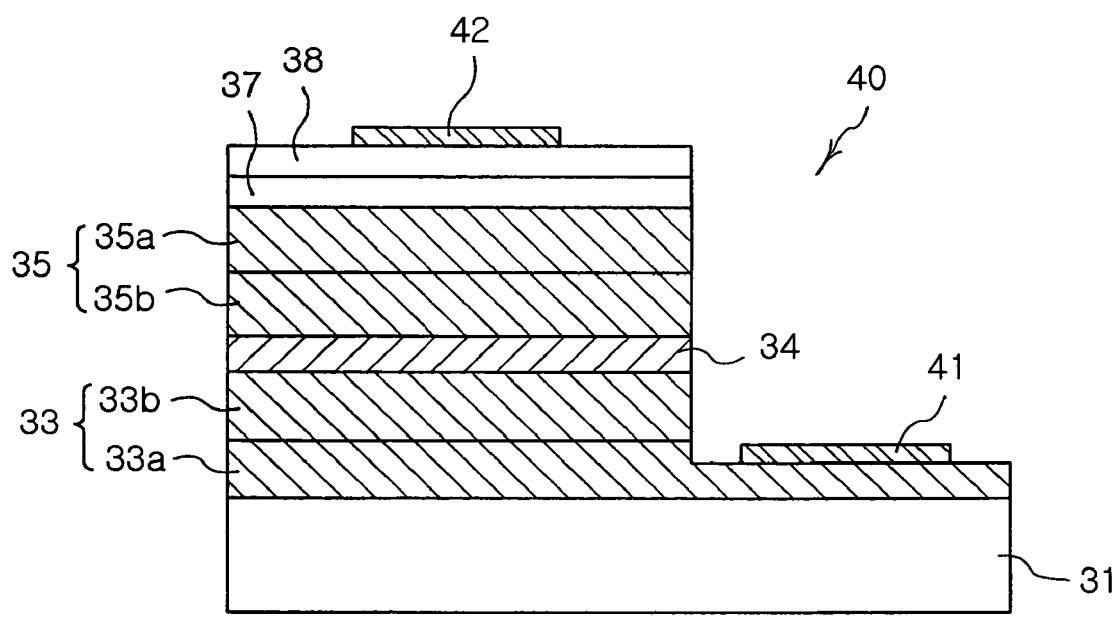
FIG. 2 is a cross-sectional view of a GaN-based semiconductor light emitting diode in accordance with one embodiment of the present invention.

FIG. 2 is a cross-sectional view of a GaN-based semiconductor light emitting diode 40 in accordance with one embodiment of the present invention. In the embodiment illustrated in FIG. 2, the TCO (Transparent Conduct Oxide) layer is made of ITO. Instead of said ITO, at least one material selected from the group consisting of ZnO, Indium Oxide and MgO can be used.

With reference to FIG. 2, the GaN-based semiconductor light emitting diode 40 comprises a sapphire substrate 31 on which a GaN base semiconductor material is grown, a lower clad layer 33 made of a first conductive semiconductor material, an active layer 34, and a second clad layer 35 made of a second conductive semiconductor material. Here, the first clad layer 33, the active layer 34 and the second clad layer 35 are sequentially formed on the sapphire substrate 31. The lower clad layer 33 made of the first conductive semiconductor material includes an n-type GaN layer 33a and an n-type AlGaN layer 33b. The active layer 34 includes an undoped InGaN layer having a multi-quantum well structure. The upper clad layer 35 made of the second conductive semiconductor material includes a p-type GaN layer 35a and a p-type AlGaN layer 35b. Generally, semiconductor crystalline layers, i.e., the lower clad layer 33, the active layer 34 and the upper clad layer 35, are grown on the sapphire substrate 31 using a process such as the MOCVD (Metal Organic Chemical Vapor Deposition) method. In order to improve lattice matching of the n-type GaN layer 33a with the sapphire substrate 31, an AlN/GaN buffer layer (not shown) may be formed on the sapphire substrate 31 prior to the growth of the n-type GaN layer 33a thereon.

Designated portions of the upper clad layer 35 and the active layer 34 are removed, thereby selectively exposing the lower clad layer 33 to the outside. A first electrode 41 is arranged on the exposed portion of the lower clad layer 33, more specifically, the n-type GaN layer 33a in FIG. 2.

A second electrode 42 is formed on an ITO (Indium Titanium Oxide) layer 38. The p-type GaN layer 35a has a higher resistance and a higher work function (approximately 7.5 eV) than those of the n-type GaN layer 33a. Accordingly, in order to form an Ohmic contact between the p-type GaN layer 35a and the ITO layer 38, an alloy layer 37 is additionally formed on the p-type GaN layer 35a. The alloy layer 37 employed by the present invention is made of one metal selected from the group consisting of La-based alloys and Ni-based alloys. Generally, $LaNi_5$ is used as the La-based alloy, and ZnNi or MgNi is used as the Ni-based alloy.

The alloy layer 37 is an intermediate layer for solving problems caused by employing the ITO layer 38 having a high transmittance. That is, the alloy layer 37 is made of a hydrogen-storing alloy, i.e., the La-based alloy such as $LaNi_5$ or the Ni-based alloy such as ZnNi or MgNi. The reason for employing the hydrogen-storing alloy is described, as follows.

The p-type GaN layer 35a is low-density doped with a dopant such as Mg. Particularly, since Mg is reacted with hydrogen (H) existing on the surface of the p-type GaN layer 35a, the density of Mg in the p-type GaN layer 35a is reduced. Thereby, the p-type GaN layer 35a has an increased Ohmic resistance. When the alloy layer 37 having a thickness of approximately 100 Å or less is formed on the upper surface of the p-type GaN layer 35a by depositing the hydrogen-storing alloy, i.e., the La-based alloy such as $LaNi_5$ or the Ni-based alloy such as ZnNi or MgNi, and is then thermally treated, the hydrogen-storing alloy absorbs hydrogen existing on the surface of the p-type GaN layer 35a, thus preventing hydrogen from being reacted with Mg serving as the dopant of the p-type GaN layer 35a, thereby activating Mg on the surface of the p-type GaN layer 35a and reducing Ohmic resistance.

Accordingly, the ITO layer 38 is firmly formed on the alloy layer 37, current injection efficiency is increased, and the Ohmic contact is formed, thus reducing a forward voltage (Vf).

The alloy layer 37 has a lower transmittance than that of the ITO layer 38. In order to improve an overall transmittance of the light emitting diode, the alloy layer 37 preferably has a thickness of approximately 100 Å or less, and more preferably has a thickness of approximately 50 Å.

In accordance with one embodiment of the present invention, in order to improve light emitting diode directed toward a semiconductor crystalline growth plane, the alloy layer 37 and the ITO layer 38 have a meshed structure. In this embodiment, the alloy layer 37 and the ITO layer 38, which has the meshed structure comprising a plurality of through holes uniformly arranged and formed in a designated shape, are formed on the p-type clad layer 35a, thereby selectively exposing the p-type clad layer 35a. Light generated from the active layer 34 is directed emitted to the outside through the exposed portions of the p-type clad layer 35a, thereby allowing overall light emitting efficiency of the light emitting diode to be improved. However, the alloy layer 37 and the ITO layer 38 of the GaN-based semiconductor light emitting diode of the present invention are not limited to the meshed structure.

FIGS. 3a to 3d are perspective views illustrating a process for manufacturing a GaN-based semiconductor light emitting diode in accordance with the present invention.

Figure 3A:
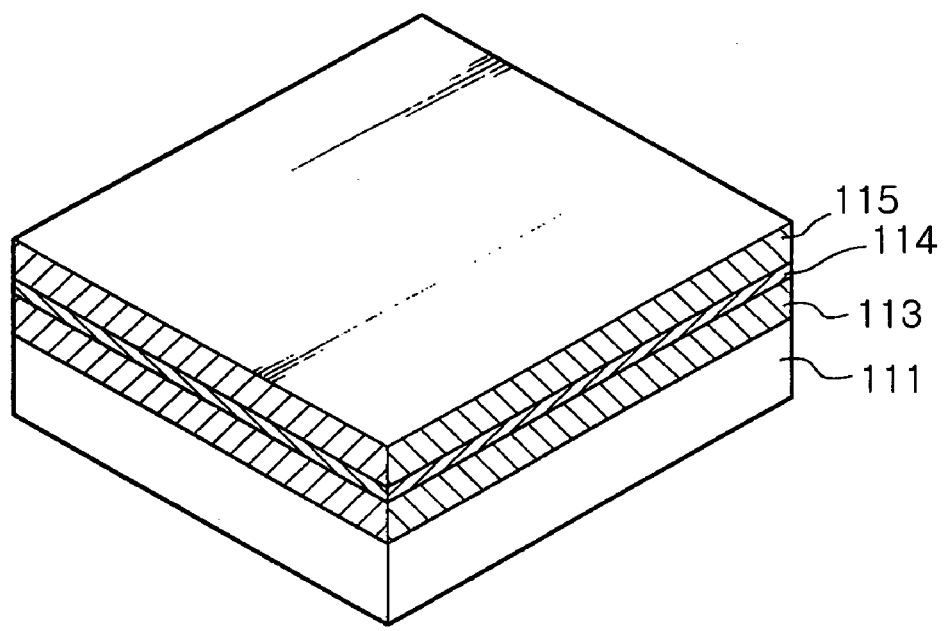
FIGS. 3a to 3d are perspective views illustrating a process for manufacturing a GaN-based semiconductor light emitting diode in accordance with the present invention.

First, as shown in FIG. 3a, a substrate 111 on which a GaN-based semiconductor material is grown is formed, and a lower clad layer 113 made of a first conductive semiconductor material, an active layer 114 and an upper clad layer 115 made of a second conductive semiconductor material are sequentially grown on the substrate 111. The substrate 111 is a sapphire substrate. Each of the lower clad layer 113 and the upper clad layer 115 includes a GaN layer and an AlGaN layer formed by the MOCVD method, as shown in FIG. 2.

Figure 3B:
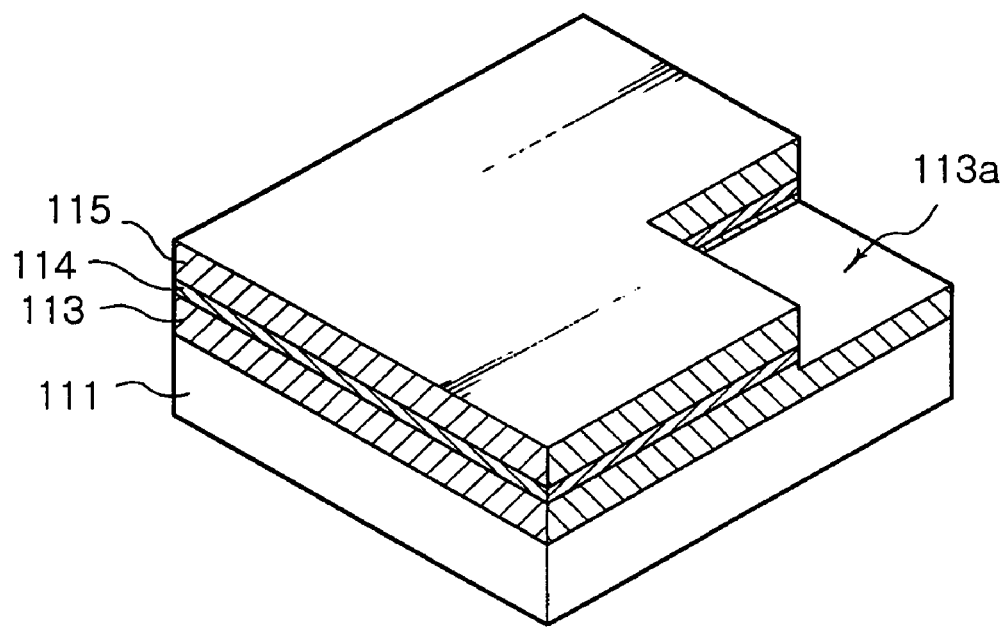

Thereafter, as shown in FIG. 3b, designated portions of the upper clad layer 115 and the active layer 114 are removed so that a portion 113a of the lower clad layer 113 is exposed. The exposed portion 113a of the lower clad layer 113 serves as an area for forming an electrode thereon. The exposed portion 113a obtained by the removal of the designated portions of the upper clad layer 115 and the active layer 114 is varied according to positions of the electrode to be formed, and the electrode to be formed has various shapes and sizes. For example, the removed portions of the upper clad layer 115 and the active layer 114 contact one edge, or the electrode to be formed is extended along sides of the substrate 111 in order to disperse current density.

Figure 3C:
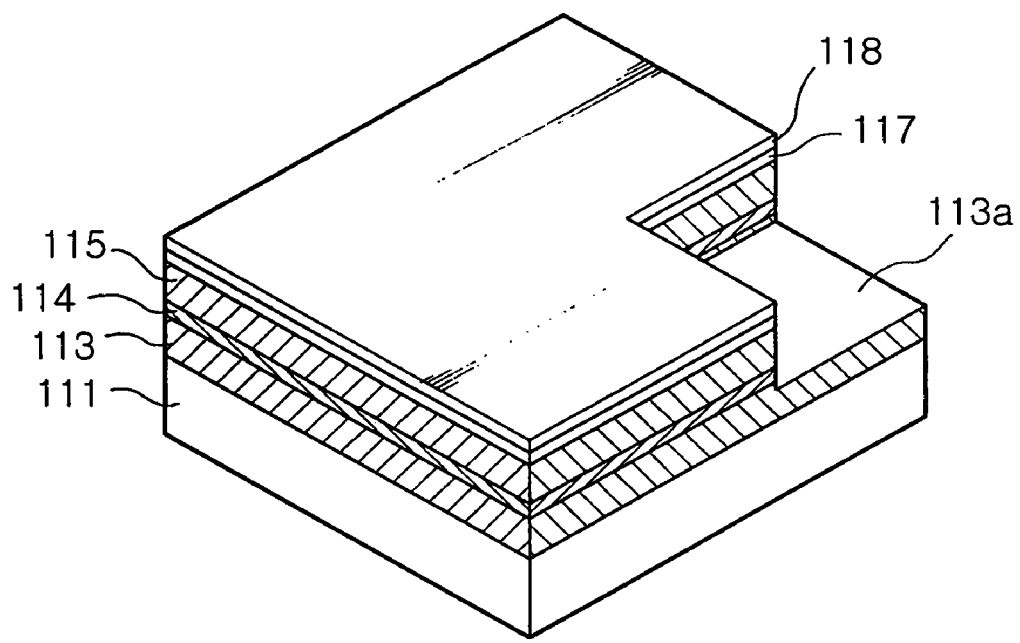

Thereafter, as shown in FIG. 3c, an alloy layer 117 and an ITO layer 118 are sequentially formed on the upper clad layer 115. In the present invention, the alloy layer 117 is made of one metal selected from the group consisting of La-based alloys and Ni-based alloys in order to improve a transmittance and form an Ohmic contact. Generally, $LaNi_5$ is used as the La-based alloy, and ZnNi or MgNi is used as the Ni-based alloy. Preferably, the alloy layer 117 and the ITO layer 118 are formed by an physical vapor evaporation method in order to prevent a contact resistance from being increased due to hydrogen ions.

Here, the alloy layer 117 and the ITO layer 118 have a meshed structure. In case that the alloy layer 117 and the ITO layer 118 have the meshed structure, as shown in FIG. 3b, a photo resist, which is arranged on the upper clad layer 115, is patterned so that the photo resist has another meshed structure, opposite to desired meshed structures of the alloy layer 117 and the ITO layer 118, and then the alloy layer 117 and the ITO layer 118 are sequentially deposited on the upper clad layer 115. Thereafter, the meshed structures of the alloy layer 117 and the ITO layer 118 are obtained by lifting off the photo resist. As described above, the meshed structures of the alloy layer 117 and the ITO layer 118 do not limit the GaN-based semiconductor light emitting diode of the present invention.

Figure 3D:
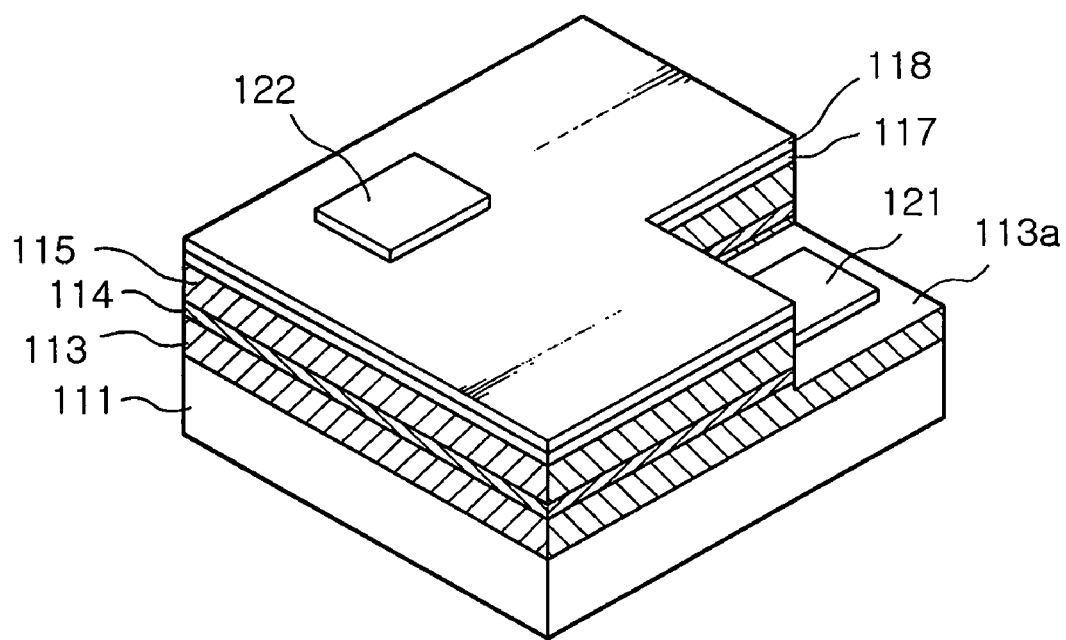

Finally, as shown in FIG. 3d, a first electrode 121 is formed on the exposed portion 113a of the lower clad layer 113, and a second electrode 122 is formed on the ITO layer 118. Prior to the formation of the first and second electrodes 121 and 122 shown in FIG. 3d, it is possible to perform an additional step of thermally treating the ITO layer 118 for improving properties of the ITO layer 118 such as transmittance. Preferably, the thermal treatment of the ITO layer 118 is performed at a temperature of approximately 200° C. or more for 30 seconds or more in an air atmosphere.

Figure 4:
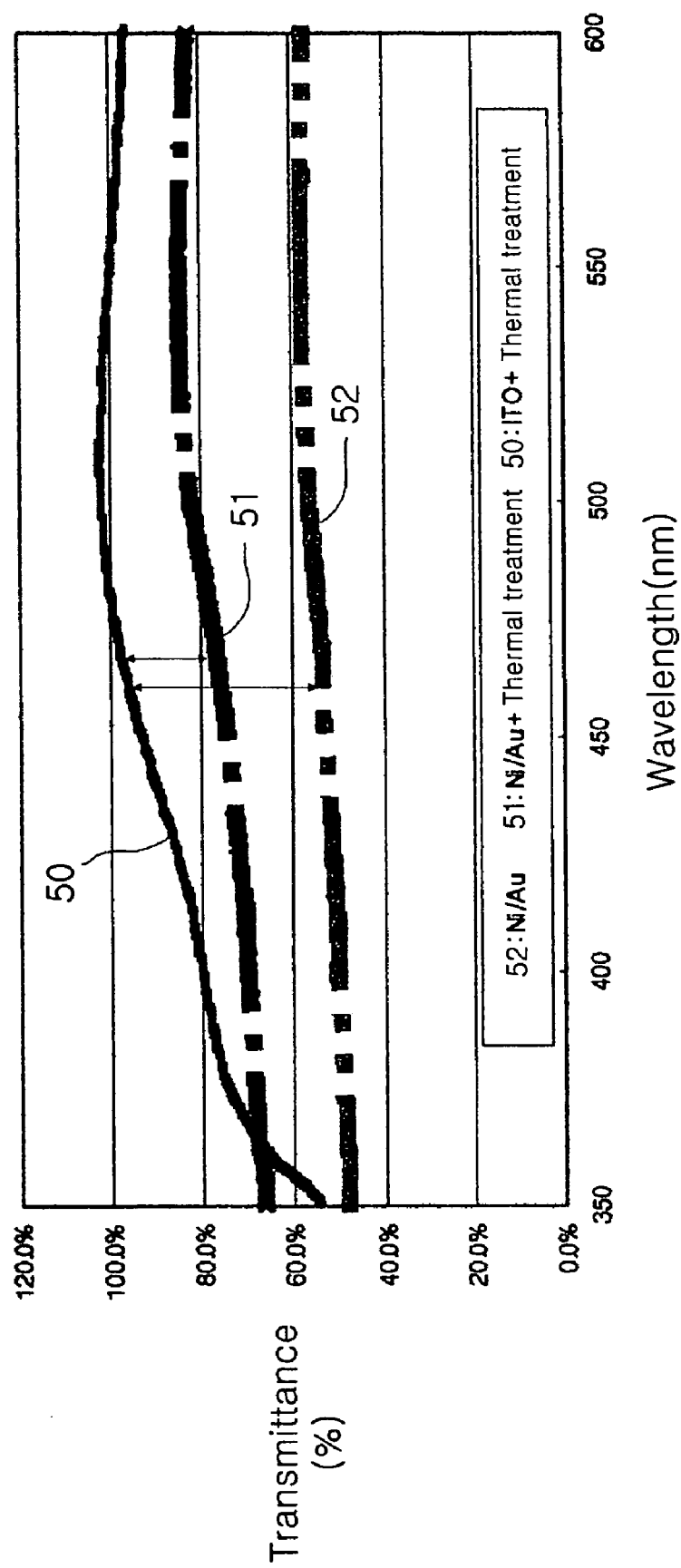
FIG. 4 is a graph comparatively showing transmittance of a Ni/Au layer of the conventional GaN-based semiconductor light emitting diode and transmittance of a $LaNi_5$/ITO layer of the GaN-based semiconductor light emitting diode of the present invention.

FIG. 4 is a graph comparatively showing transmittance of a Ni/Au layer of the conventional GaN-based semiconductor light emitting diode and transmittance of a $LaNi_5$/ITO layer of the GaN-based semiconductor light emitting diode of the present invention. A curve 52 represents the transmittance of the Ni/Au layer formed on the p-type GaN layer of the conventional GaN-based semiconductor light emitting diode, and the above transmittance does not exceed 60% at a light wavelength band of 350 nm to 600 nm. Particularly, the transmittance of the Ni/Au layer of the conventional GaN-based semiconductor light emitting diode is approximately 50% at a light wavelength band of 450 nm to 500 nm for blue or green rays.

A curve 51 represents the transmittance of the Ni/Au layer formed on the p-type GaN layer of the conventional GaN-based semiconductor light emitting diode, after the thermal treatment of the Ni/Au layer. Compared to the curve 52 representing the transmittance of the Ni/Au layer formed on the p-type GaN layer of the conventional GaN-based semiconductor light emitting diode prior to the thermal treatment of the Ni/Au layer, the curve 51 illustrates that the transmittance of the thermally treated Ni/Au layer is improved by a designed level. However, the transmittance of the thermally treated Ni/Au layer of the conventional GaN-based semiconductor light emitting diode is still approximately 70% to 80% at a light wavelength band of 450 nm to 500 nm.

On the other hand, a curve 50 represents the transmittance of the $LaNi_5$/ITO layer of the GaN-based semiconductor light emitting diode of the present invention. Particularly, the curve 50 represents the transmittance of the $LaNi_5$/ITO layer, which was thermally treated. As shown in FIG. 4, the transmittance of the $LaNi_5$/ITO layer of the GaN-based semiconductor light emitting diode of the present invention is higher than that of the Ni/Au layer of the conventional GaN-based semiconductor light emitting diode at all light wavelength bands. Particularly, the transmittance of the LaNi$_5$/ITO layer of the GaN-based semiconductor light emitting diode of the present invention, which is approximately 90% to 100% at a light wavelength band of 450 nm to 500 nm for blue or green rays, is higher than that of the Ni/Au layer of the conventional GaN-based semiconductor light emitting diode by approximately 20% or more. The above improvement of the transmittance is an important factor for improving the luminance of light emitted from the semiconductor light emitting diode.

Figure 5:
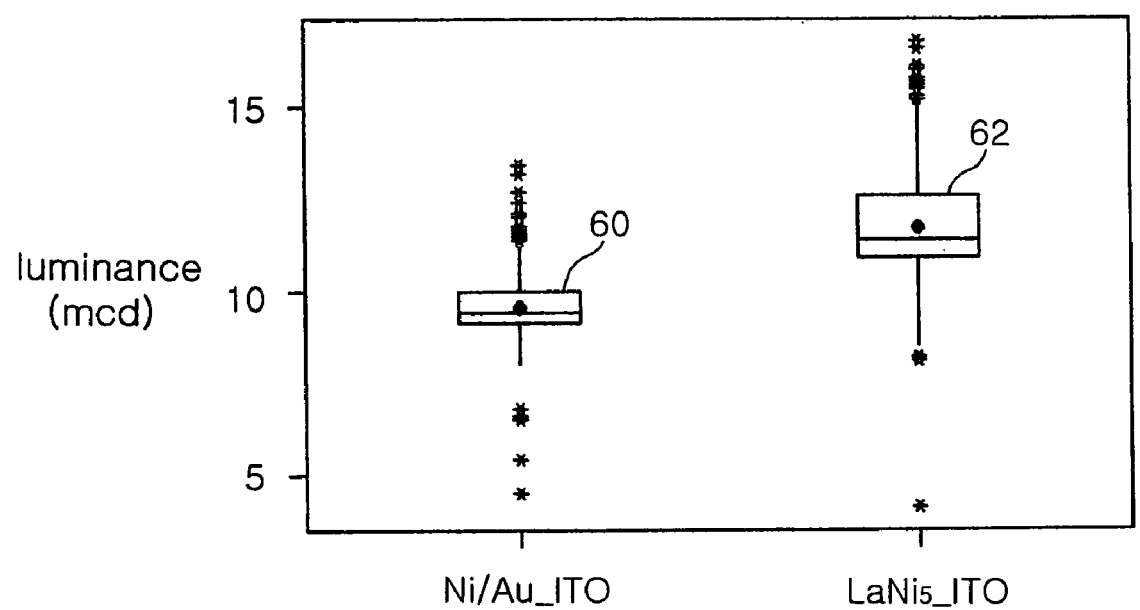
FIG. 5 is a graph comparatively showing luminance of the conventional GaN-based semiconductor light emitting diode and luminance of the GaN-based semiconductor light emitting diode of the present invention.

FIG. 5 is a graph comparatively showing luminance of the conventional GaN-based semiconductor light emitting diode and luminance of the GaN-based semiconductor light emitting diode of the present invention. As described above with reference to FIG. 4, the transmittance of the thermally treated LaNi$_5$/ITO layer of the GaN-based semiconductor light emitting diode of the present invention is higher than that of the Ni/Au layer of the conventional GaN-based semiconductor light emitting diode by approximately 20% or more. Since the improvement of the transmittance means an improvement in luminance, the luminance of the GaN-based semiconductor light emitting diode of the present invention is higher than that of the conventional GaN-based semiconductor light emitting diode. With reference to FIG. 5, while the luminance 60 of the conventional GaN-based semiconductor light emitting diode is approximately 9 mcd to 10 mcd, the luminance 62 of the GaN-based semiconductor light emitting diode of the present invention is approximately 11 mcd to 13 mcd. That is, compared to the conventional GaN-based semiconductor light emitting diode, the GaN-based semiconductor light emitting diode of the present invention has a remarkably improved luminance.

As apparent from the above description, the present invention provides a GaN-based semiconductor light emitting diode, in which an alloy layer made of a hydrogen-storing alloy, i.e., La-based alloy such as LaNi$_5$, or Ni-based alloy such as ZnNi or MgNi, is formed on a p-type GaN layer prior to the formation of an ITO layer having a high transmittance and serving as a transparent electrode so as to prevent reaction between Mg, serving as a dopant of the p-type GaN layer, and hydrogen, and then to activate Mg, and a method for manufacturing the GaN-based semiconductor light emitting diode, thus reducing Ohmic resistance and allowing desired Ohmic contact to be formed. Further, the ITO layer is formed on the upper surface of the alloy layer by thermal treatment, thus allowing the GaN-based semiconductor light emitting diode to maintain a high transmittance and to obtain a high luminance property at a constant driving voltage.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A GaN-based semiconductor light emitting diode, comprising:
   a substrate on which a GaN-based semiconductor material is grown;
   a lower clad layer formed on the substrate, and made of a GaN semiconductor material doped with an n-type dopant;
   an active layer formed on a designated portion of the lower clad layer, and made of an undoped GaN semiconductor material;
   an upper clad layer formed on the active layer, and made of a GaN semiconductor material doped with a p-type dopant;
   an alloy layer which is formed on the upper clad layer to directly contact a surface of the upper clad layer, consists essentially of Zn and Ni, and absorbs hydrogen existing on the surface of said upper clad layer to prevent the p-type dopant from combining with said hydrogen; and
   an TCO (Transparent Conduct Oxide) layer formed on the alloy layer.

2. The GaN-based semiconductor light emitting diode as set forth in claim 1, wherein the alloy layer has a thickness of 100Å or less.

3. The GaN-based semiconductor light emitting diode as set forth in claim 1, wherein the TCO (Transparent Conduct Oxide) layer is made of at least one material selected from the group consisting of ITO, ZnO, Indium Oxide and MgO.

4. A GaN-based semiconductor light emitting diode, comprising:
   a substrate on which a GaN-based semiconductor material is grown;
   a lower clad layer formed on the substrate, and made of a GaN semiconductor material doped with an n-type dopant;
   an active layer formed on a designated portion of the lower clad layer, and made of an undoped GaN semiconductor material;
   an upper clad layer formed on the active layer, and made of a GaN semiconductor material doped with a p-type dopant;
   a ZnNi alloy layer which is formed on the upper clad layer, directly contacts a surface of the upper clad layer, and absorbs hydrogen existing on the surface of said upper clad layer to prevent the p-type dopant from combining with said hydrogen; and
   an TCO (Transparent Conduct Oxide) layer formed on the alloy layer.

5. The GaN-based semiconductor light emitting diode as set forth in claim 4, wherein the alloy layer has a thickness of 100Å or less.

6. The GaN-based semiconductor light emitting diode as set forth in claim 4, wherein the TCO (Transparent Conduct Oxide) layer is made of at least one material selected from the group consisting of ITO, ZnO, Indium Oxide and MgO.

* * * * *